United States Patent
Bai et al.

(10) Patent No.: US 10,454,243 B2
(45) Date of Patent: Oct. 22, 2019

(54) LIGHT SOURCE DRIVER CIRCUIT THAT USES A LOW SUPPLY VOLTAGE AND IS CAPABLE OF OPERATING AT A HIGH BANDWIDTH

(71) Applicant: Avago Technologies Interational Sales Pte. Limited, Singapore (SG)

(72) Inventors: Dezhao Bai, Sunnyvale, CA (US); Vishal Giridharan, San Jose, CA (US); Faouzi Chaahoub, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/445,029

(22) Filed: Feb. 28, 2017

(65) Prior Publication Data

US 2018/0248337 A1 Aug. 30, 2018

(51) Int. Cl.
*H01S 5/042* (2006.01)
*H01S 5/183* (2006.01)
*H01S 5/068* (2006.01)

(52) U.S. Cl.
CPC ............ *H01S 5/042* (2013.01); *H01S 5/0427* (2013.01); *H01S 5/06808* (2013.01); *H01S 5/183* (2013.01)

(58) Field of Classification Search
CPC .... H01S 5/042; H01S 5/06808; H01S 5/0427; H01S 5/183
See application file for complete search history.

(56) References Cited

U.S. PATENT DOCUMENTS

| | | | |
|---|---|---|---|
| 6,370,175 B1 * | 4/2002 | Ikeda | H04N 1/40037 347/236 |
| 7,269,194 B2 | 9/2007 | Diaz et al. | |
| 7,280,574 B1 * | 10/2007 | Khawshe | H01S 5/042 372/38.02 |
| 2004/0114649 A1 * | 6/2004 | Asuri | H01S 5/06832 372/38.02 |
| 2009/0003401 A1 | 1/2009 | Sekiguchi | |
| 2012/0062143 A1 | 3/2012 | Sugawara et al. | |
| 2015/0104190 A1 * | 4/2015 | Uchino | H04B 10/58 398/159 |
| 2015/0255955 A1 | 9/2015 | Wang et al. | |

* cited by examiner

*Primary Examiner* — Yuanda Zhang
(74) *Attorney, Agent, or Firm* — Sheridan Ross P.C.

(57) ABSTRACT

A light source driver circuit is provided that has at least first and second current source circuits that are electrically coupled to a node of the driver circuit. The first and second current source circuits source first and second fractions, respectively, of a total current needed to drive a light source into a node of the driver circuit. The driver circuit uses a sum of the first and second fractions of the total current in combination with a modulation current to drive the light source. By incorporating at least first and second current source circuits into the driver circuit, each of the current sources can be kept sufficiently small in size that they contribute very little parasitic capacitance, and therefore allow the driver circuit to achieve high-bandwidth operations while also allowing the driver circuit to operate at a low supply voltage.

20 Claims, 8 Drawing Sheets

LIGHT SOURCE DRIVER CIRCUIT THAT USES A LOW SUPPLY VOLTAGE AND IS CAPABLE OF OPERATING AT A HIGH BANDWIDTH

TECHNICAL FIELD OF THE INVENTION

The invention relates to light source driver circuits. More particularly, the invention relates to a light source driver circuit that uses a low supply voltage and that is capable of operating at high bandwidth.

BACKGROUND OF THE INVENTION

Vertical cavity surface emitting laser diodes (VCSELs) are laser diodes that generate light when driven with an electrical current. In general, an input electrical current drives the anode of the VCSEL causing the light emitting region, or aperture, of the VCSEL to emit a laser light beam. A VCSEL driver circuit is a circuit, typically an integrated circuit (IC), that receives a high-speed electrical voltage signal, converts this electrical voltage signal into an electrical current signal, and drives the anode of the VCSEL with a static direct current (DC) bias current that modulated with the converted high-speed current signal.

Figure 1:
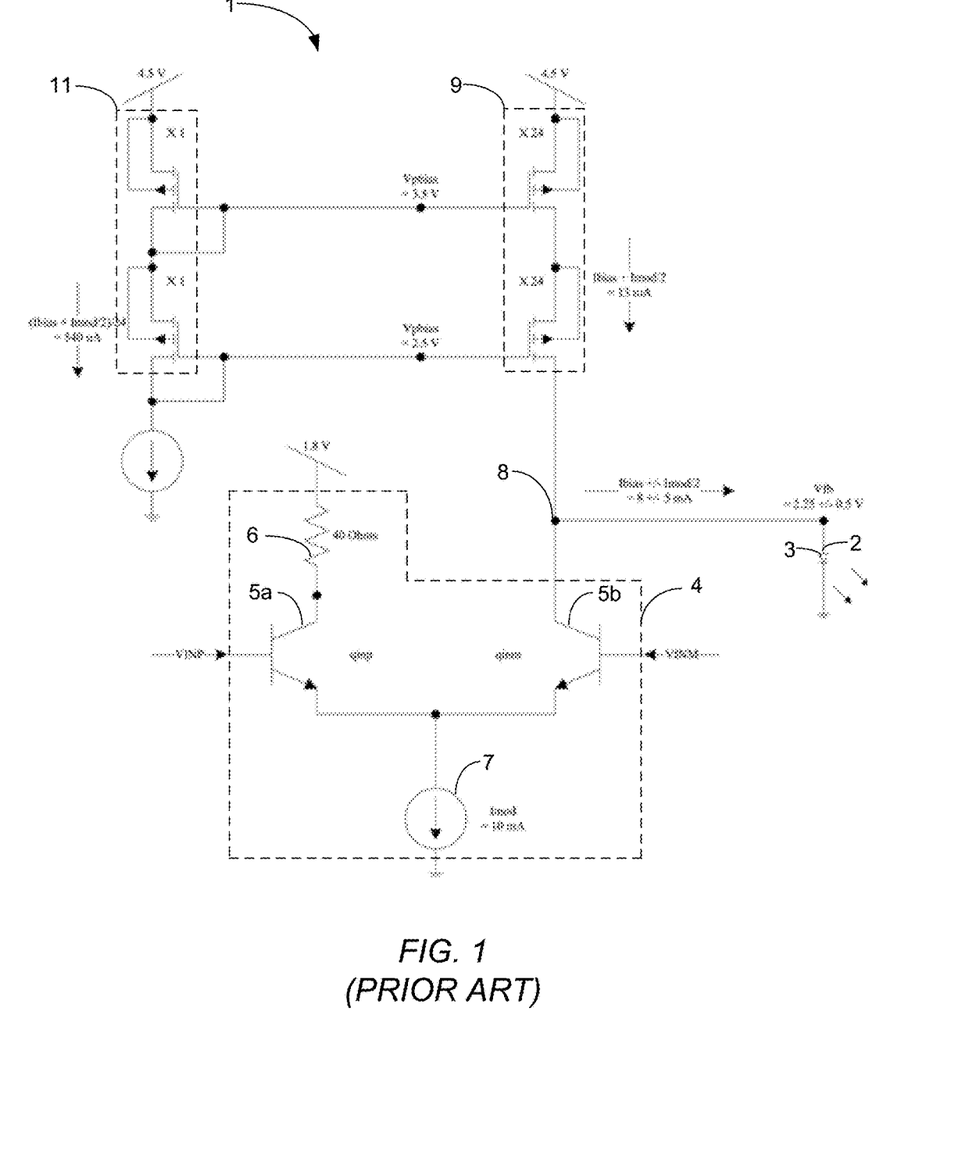
FIG. 1 illustrates a typical final output stage of a typical laser driver IC that uses a 4.5-volt voltage supply.

FIG. 1 illustrates a typical final output stage of a typical laser driver IC 1 that uses a 4.5-volt voltage supply. The anode 2 of the VCSEL 3 is driven with a bias current of 8 milliampere (mA) along with a modulation current of 10 mA (+/−5 mA). A modulator circuit 4 comprises an emitter-coupled NPN bipolar junction transistor (BJT) differential pair comprising first and second emitter coupled BJTs 5a and 5b, respectively, a load resistor 6 and current tail 7. The NPN BJT differential pair senses the polarity of the electrical input signal, VINP and VINM, and sinks either 0 mA or 10 mA from the output node 8 of the VCSEL driver IC 1. A P Metal Oxide Semiconductor Field Effect Transistor (PMOSFET) current source 9 sources a current equal to the sum of the bias current and one-half of the modulation current. PMOSFETs 11 comprise a current mirror. The difference between the current sourced by the PMOSFET current source 9 and the current sunk by the NPN BJT differential pair 5a, 5b is sent to the output node 8.

The PMOSFETs used in the PMOSFET current source 9 generally have a poor current-to-device dimension ratio compared to NPN BJTs for the same voltage across the device. Consequently, a PMOSFET current source presents more parasitic capacitance at its output terminals, resulting in poor high-bandwidth performance. In order to keep the parasitic capacitance contribution of the PMOSFETs to a minimum, they are typically permitted to have a large voltage across them, so that they can be kept small in size. Furthermore, the PMOSFET current source 9 is cascoded to keep the output resistance of the laser driver IC 1 high; which nearly doubles the required voltage headroom across the PMOSFET current source 9. These considerations mandate the need for a 4.5-volt voltage supply, which typically needs to be generated using a boost regulator (not shown) in a 3.3-volt system. The need for a boost generator has negative implications in terms of product area, power consumption, and cost.

Figure 2:
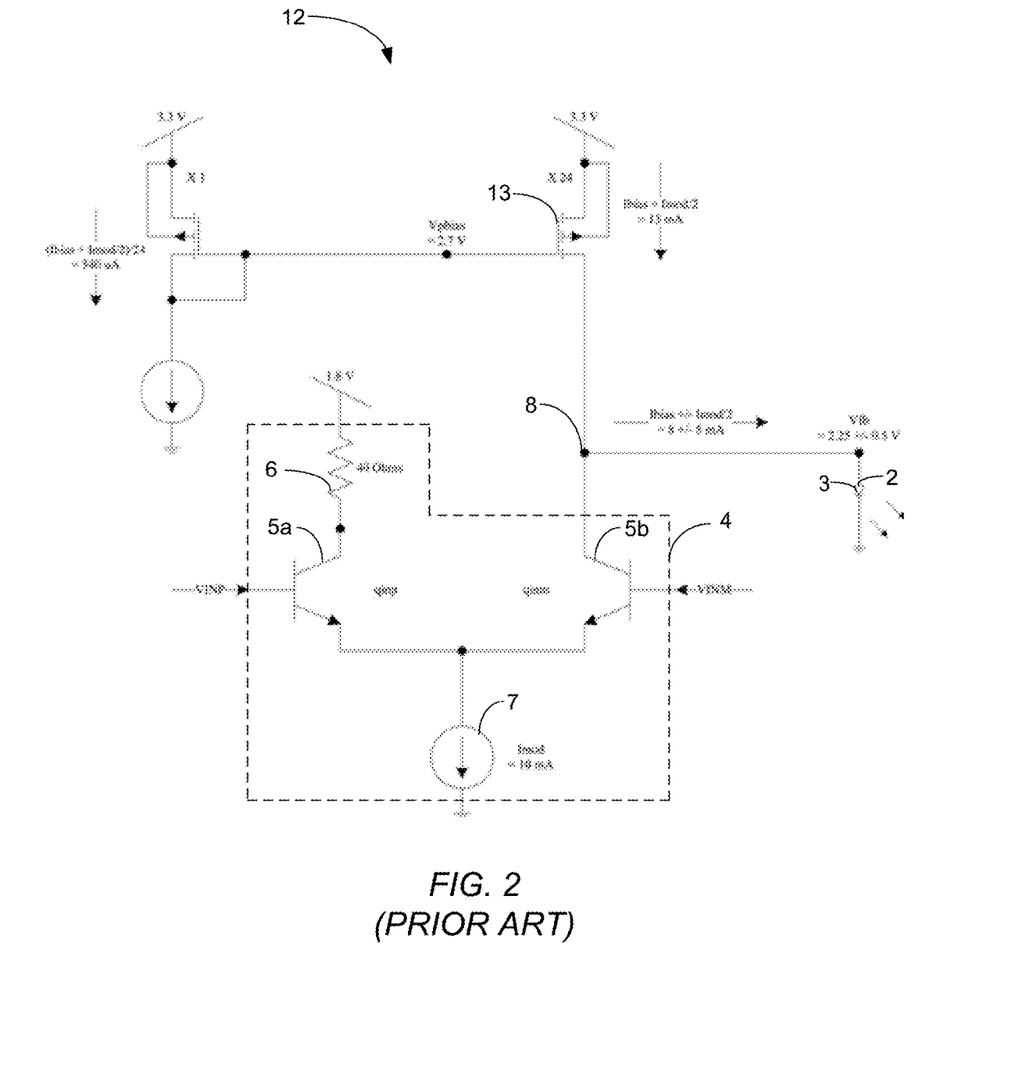
FIG. 2 illustrates a final output stage of a laser driver IC that has been modified to use a 3.3-volt voltage supply by eliminating the cascoded arrangement in the PMOSFET current source shown in FIG. 1 and increasing the size of the PMOSFET current source to allow the supply voltage to be reduced.

Attempts have been made to replace the 4.5-volt voltage supply with a 3.3-volt voltage supply that remove the cascoded arrangement in the PMOSFET current source and increase the size of the PMOSFET current source to account for the loss of 1.2 volts of current source headroom. FIG. 2 illustrates a final output stage of a laser driver IC 12 that has been modified as such to use a 3.3-volt voltage supply by eliminating the cascoded arrangement in the PMOSFET current source 13 and increasing the size of the PMOSFET current source 13 to allow the supply voltage to be reduced. One disadvantage of the laser driver IC 12 is that the increase in the size of the PMOSFET current source 13 results in a significant increase in parasitic capacitance, which, in turn, results in an unacceptable loss in bandwidth.

Accordingly, a need exists for a laser driver circuit that is capable of operating at a low supply voltage and that is capable of achieving high-bandwidth performance.

DETAILED DESCRIPTION

In accordance with illustrative embodiments, a light source driver circuit is provided that has a modulation circuit, at least first and second current source circuits that are electrically coupled to a node of the driver circuit. The driver circuit has an output terminal that is electrically coupled, either directly or indirectly, to the node and that is disposed to be electrically coupled to an electrode of a light source. The first current source circuit sources a first fraction of a total current needed to drive a light source into the node. The second current source circuit sources a second fraction of the total current needed to drive the light source into the node. The driver circuit uses substantially a sum of the first and second fractions of the total current to drive the light source. The drive current of the light source is determined by the first fraction, the second fraction and the current that dissipates through the modulation circuit. However, the current that dissipates through the modulation circuit is generally negligible compared to the first and second fractions of the total current. The first current source circuit is coupled to the node through via a transistor. The second current source circuit is coupled to the node through a resistor. By incorporating the transistor-based first current source circuit, and the resistor-based second current source circuit into the driver circuit, each of the current sources can be kept sufficiently small in size that they contribute very little parasitic capacitance, and therefore allow the driver circuit to achieve high-bandwidth operations. The small size of the current sources also ensures that the voltage drop across them is sufficiently small that laser driver circuit can operate at a low supply voltage.

Exemplary embodiments will now be described with reference to the figures, in which like reference numerals represent like components, elements or features. It should be noted that features, elements or components in the figures are not intended to be drawn to scale, emphasis being placed instead on demonstrating inventive principles and concepts.

In the following detailed description, for purposes of explanation and not limitation, exemplary, or representative, embodiments disclosing specific details are set forth in order to provide a thorough understanding of inventive principles and concepts. However, it will be apparent to one of ordinary skill in the art having the benefit of the present disclosure that other embodiments according to the present teachings that are not explicitly described or shown herein are within the scope of the appended claims. Moreover, descriptions of well-known apparatuses and methods may be omitted so as not to obscure the description of the exemplary embodiments. Such methods and apparatuses are clearly within the scope of the present teachings, as will be understood by those of skill in the art.

It should also be understood that the word "example," as used herein, is intended to be non-exclusionary and non-limiting in nature. More particularly, the word "exemplary" as used herein indicates one among several examples, and it must be understood that no undue emphasis or preference is being directed to the particular example being described. It should also be understood that the word "exemplary," as used herein, is intended to be non-exclusionary and non-limiting in nature. More particularly, the word "exemplary," as used herein, indicates one among several examples, and no undue emphasis or preference is being directed to the particular example being described.

The terminology used herein is for purposes of describing particular embodiments only, and is not intended to be limiting. The defined terms are in addition to the technical, scientific, or ordinary meanings of the defined terms as commonly understood and accepted in the relevant context. For example, when the word PMOS is used, a person skilled in the art would understand that the circuit may be changed into a configuration to change all PMOS transistors with NMOS transistors. Therefore, a similar circuit having NMOS transistors is also within the inventive principles and concepts. Other suitable types of transistors such as bipolar transistors using similar circuitry topology may be considered as well. Similarly, when the term "a signal" is used herein, it is understood that the signal may be a differential signal that requires two input and output terminals. When the term "two input terminals" is used, it is understood that the term may include having a differential input signal which requires two input terminals. The term "voltage supply" may include the positive node (VDD) or the negative node (GND) of the power supply.

The terms "a," "an" and "the" include both singular and plural referents, unless the context clearly dictates otherwise. Thus, for example, "a device" includes one device and plural devices. The term "substantially" means to within limits or degrees acceptable to those of skill in the art. For example, the term "substantially parallel to" means that a structure or device may not be made perfectly parallel to some other structure or device due to tolerances or imperfections in the process by which the structures or devices are made. The term "approximately" means to within an acceptable limit or amount to one of ordinary skill in the art. Where a first device is said to be directly connected or directly coupled to a second device, this encompasses examples where the two devices are connected together without any intervening devices other than electrical connectors (e.g., wires). Where a first device is said to be electrically coupled to a second device, this encompasses examples where the two devices are directly connected together without any intervening devices other than electrical connectors (e.g., wires) and examples where the first and second devices are electrically connected to one another via one or more intervening devices (e.g., one or more resistors).

Exemplary embodiments will now be described with reference to the figures, in which like reference numerals represent like components, elements or features. It should be noted that features, elements or components in the figures are not intended to be drawn to scale, emphasis being placed instead on demonstrating inventive principles and concepts.

Figure 3:
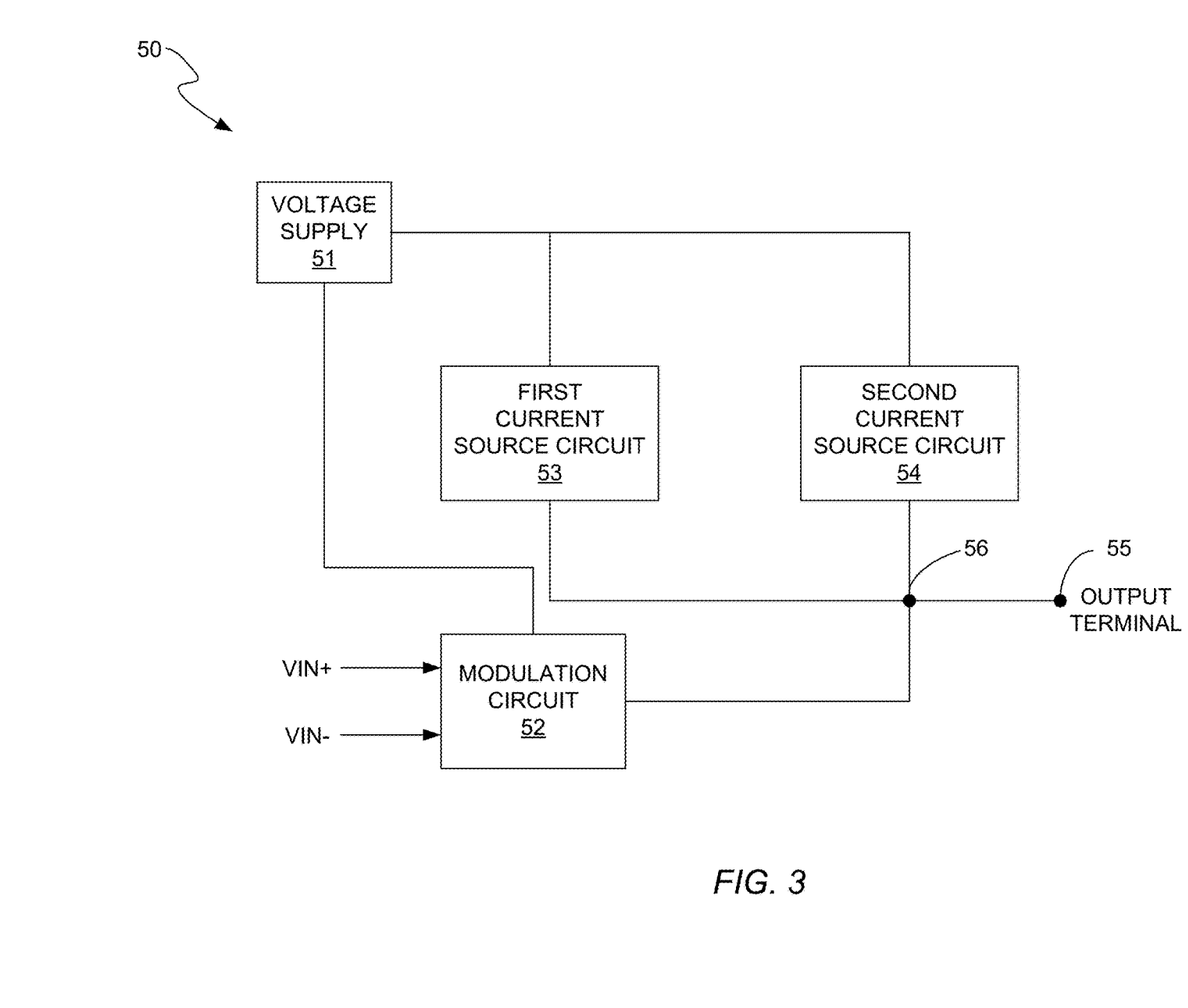
FIG. 3 illustrates a system-level block diagram of the low-power, high-bandwidth laser driver circuit in accordance with an exemplary embodiment.

FIG. 3 illustrates a system-level block diagram of the low-power, high-bandwidth laser driver circuit 50 in accordance with an exemplary embodiment. A voltage supply 51 supplies a low supply voltage to a modulation circuit 52 and to first and second current source circuits 53 and 54, respectively, of the laser driver circuit 50. The first and second current sources 53 and 54, respectively, generate first and second fractions, respectively, of a total bias current needed to bias a laser or a light source (not shown). An output terminal 55 of the laser driver circuit 50 is disposed for connection to a cathode or anode of a laser, such as a VCSEL, for example. The first and second fractions of the total bias current are summed together at an output node 56 of the laser driver circuit 50 to obtain the total bias current. Following Kirchoff's Current Law, the current flowing to the output terminal 55 is the sum of the first and second fractions, as well as the current that dissipates through the modulation circuit 52. However, the current that dissipates through the modulation circuit 52 is relatively small compared to the first and second fractions of the total bias current. In one embodiment, the first fraction may be approximately 10 mA, the second fraction may be approximately 8 mA, the current that flows to the output terminal 55 is approximately 18 mA, but the current that dissipates through the modulation circuit 52 may be less than one hundred micro amperes. For this reason, the sum of the first and second fractions of the total bias current are considered to be substantially equal to the total bias current needed to drive at least a light source coupled to the output terminal 55.

The modulation circuit 52 receives first and second input data signals of opposite polarity, VIN+ and VIN−, at first and second terminals, respectively, of the modulation circuit 52 and generates a modulation current that is summed with the total bias current at the output node 56. The first and second input data signals of opposite polarity, VIN+ and VIN−, may be referred to as a differential signal. In one embodiment, the modulation circuit may receive a single ended signal with one input terminal. In another embodiment, the modulation circuit may receive two single ended signals with two input terminals. Therefore, when it is mentioned that a modulation circuit 52 has an input terminal to receive an input data signal, all variations explained above are all included.

The sum of the modulation current and the total bias current drives a laser (not shown) electrically coupled with the output terminal 55. The first and second current sources 53 and 54, respectively, are configured to operate at the low supply voltage provided by the voltage supply 51 and to contribute very little parasitic capacitance, thereby enabling the laser driver circuit 50 to operate at very high bandwidths associated with an input data signal labeled as VIN+ and VIN− to indicate the differential signal. The first current source circuit 53 may be coupled to the output terminal 55 through a transistor. The transistor may be a PMOS transistor biased at an operating state to provide a predetermined current. The second current source circuit 54 may be coupled to the output terminal 55 through a resistor. Generally the resistor is a low-resistance resistor having a resistance value lower than approximately 90 ohms. The first current source circuit 53 may be configured to provide a first fraction of the total bias current needed to drive the laser (not shown). The second current source circuit 54 may be configured to provide a second fraction of the total bias current needed to drive the laser (not shown). The second fraction is approximately equal to or less than the first fraction.

Intelligently splitting the total bias current into the first and second fractions in the first current source circuit 53 and the second current source circuit 54 may enable the drive current to be generated at high speed with a low supply voltage. More specifically, the first current source circuit 53 that is coupled to the output terminal 55 is configured to provide the first fraction of the total bias current. On the other hand, the second current source circuit 54 that is coupled to the output terminal 55 to provide the second fraction of the total bias current without adding parasitic capacitance, which enables the driver circuit 50 to operate at high speed. The second current source circuit 54 may cause power to be dissipated through the resistor.

In one embodiment, the second fraction is approximately 40% to 50% of the total bias current. The voltage level at the output terminal 55 may change when the input signal changes. Changes of the voltage level at the output terminal 55 may affect the value of the second fraction. In some embodiments, the second current source circuit 54 may comprise a control circuit operable to maintain the second fraction within the 40% to 50% range. The first and second current source circuits 53 and 54, respectively, may respond to the changes of the data input signal at different rates. The first current source circuit 53 reacts to a change of the data input signal at a first rate and the second current source circuit 54 reacts to the change of the data input signal at a second rate faster than the first rate. Therefore, when there is a change in the data input signal that requires a change of the drive current at the output terminal 55, the changes of the drive current due to the change of the data input signal is substantially drawn from the second current source circuit 54 relative to the first current source circuit 53.

When in use, the output terminal 55 is coupled to a circuit branch comprising at least one light source. The output resistance seen at the output terminal 55 may be halved or significantly reduced because the resistor at the second current source circuit 54 is in parallel arrangement with the resistance seen at the output circuit branch having the at least one light source. Therefore, the resistance seen at the output circuit branch may be parasitic resistance and/or the resistance seen at the at least one light source.

Adding the resistor at the second current source circuit 54 may contribute to additional power consumption. However, by providing the second current source circuit 54 to supply a substantial portion of the total drive current, the size of the transistor in the first current source circuit 53 may be reduced and this effectively enables the driver circuit 50 to operate at a high speed. The additional power consumption can be trade-off to obtain the high speed performance, but combining the first and second current source circuits 53 and 54, respectively, intelligently may improve the overall performance of the driver circuit 50 and yield a desirable technical effect. Examples (non-exhaustive) of the manner in which the first and second current sources 53 and 54, respectively, may be configured to achieve these goals are described below in detail with reference to FIGS. 4-7.

It should be noted that driver circuit is described herein as a laser driver circuit for driving a laser, such as a VCSEL, the inventive principles and concepts apply to any driver circuit for driving a light source. The light source can be any type of light source including, for example a P-intrinsic-N (PIN) diode, a light emitting diode (LED), etc. For exemplary purposes, the driver circuit is described herein as a laser driver circuit and the light source is described herein as a laser, and in particular, a VCSEL.

Figure 4:
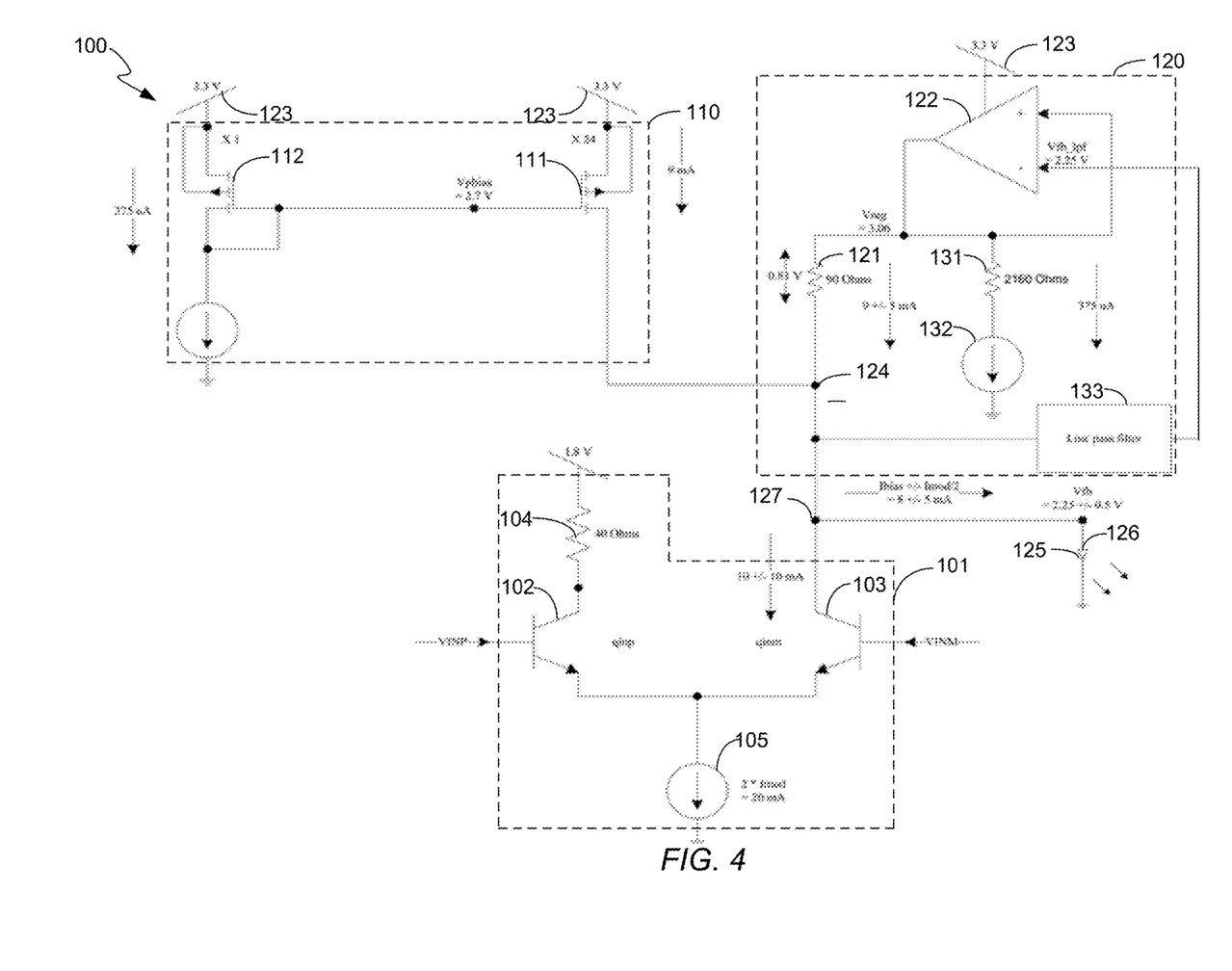
FIG. 4 illustrates a block diagram of a laser driver circuit in accordance with an exemplary embodiment that uses a low supply voltage and that is capable of achieving high-bandwidth operations.

FIG. 4 illustrates a block diagram of a laser driver circuit 100 in accordance with an exemplary embodiment that uses a low supply voltage and that is capable of achieving high-bandwidth operations. In accordance with a first exemplary embodiment, the laser driver circuit 100 uses a 3.3-volt voltage supply and the first and second current source circuits comprise a transistor-based current source circuit 110 and a resistor-based current source circuit 120, respectively. In accordance with this exemplary embodiment, the transistor-based current source circuit 110 comprises a PMOSFET current source 111 and a PMOSFET current mirror 112 and the resistor-based current source circuit 120 comprises a resistor 121 and a voltage regulator circuit 122. The transistor-based current source circuit 110 and the resistor-based current source circuit 120 are electrically in parallel with one another and each is electrically coupled to the 3.3-volt voltage supply 123 and to node 124. The laser driver circuit 100 includes a modulator circuit 101 comprising first and second BJTs 102 and 103, respectively, a load resistor 104 and a current tail 105. The modulator circuit 101 may be identical to, and operate in the same manner as, the modulator circuit 4 shown in FIGS. 1 and 2.

In accordance with this exemplary embodiment, a total bias current of 18 mA is sourced by the parallel combination of the transistor-based and resistor-based current sources 110 and 120, respectively, into node 124. Each of the transistor-based and resistor-based current sources 110 and 120, respectively, sources one-half of the total bias current into node 124, although the fractions of the total bias current that are sourced by the current sources 110 and 120 can be varied to fractions other than one-half, as will be described below in more detail. A laser 125 having an anode 126 that is electrically coupled to an output node 127 of the laser driver circuit 100 is driven by the total bias current plus the modulation current produced by the modulation circuit 101 at the output node 127. The output node 127 is electrically coupled to node 124, and therefore node 124 may also be considered the output node of the laser driver circuit 100. In accordance with this exemplary embodiment, the laser 125 is a VCSEL, although the inventive principles and concepts are not limited to the laser 125 being any particular type of laser.

The division of the total bias current sourcing requirements between the transistor-based and resistor-based current source circuits 110 and 120, respectively, ensures that the current through the PMOSFET current source 111 is small enough that the PMOSFET current source 111 can be small enough in size to have a very low parasitic capacitance. The division of the total bias current sourcing requirements between the transistor-based and resistor-based current source circuits 110 and 120, respectively, also ensures that the voltage drop across the resistor 121 is small enough to allow the output voltage of the voltage regulator 122 to be less than 3.3 volts. The reduced parasitic capacitance allows the laser driver circuit 100 to achieve high-bandwidth performance while the reduced output voltage requirement of the voltage regulator 122 allows the laser driver circuit 100 to have a low supply voltage, which is a 3.3-volt voltage supply in this exemplary embodiment.

In addition, the resistor 121, which has a resistance of 90 ohm in the exemplary embodiment, reduces the effective output resistance of the laser driver circuit by a factor of two, assuming the laser 125 is a VCSEL having a resistance of approximately 80 Ohms. This reduction in the effective output resistance of the laser driver circuit 100 doubles its bandwidth since the resistor-capacitor (RC) time constant at the output of the laser driver circuit 100 is cut in half. In order to avoid too large of a voltage drop across the resistor 121, the PMOSFET current source 111 supplies the fraction of the total bias current that the resistor 121 cannot be used to source. The amount of current flowing through the resistor 121 is controlled by the voltage regulator 122.

In accordance with this exemplary embodiment, the resistor-based current source 120 also includes a reference resistor 131, a reference current source 132 that drives the reference resistor 131, and a lowpass filter circuit 133. The lowpass filter circuit 133 has an input terminal that is electrically coupled to node 124 and an output terminal that is electrically coupled to a first input terminal of the voltage regulator 122. A second input terminal of the voltage regulator 122 is electrically coupled to a first terminal of the reference resistor 131. A second terminal of the reference resistor 131 is electrically coupled to the reference current source 132. An output terminal of the voltage regulator 122 is electrically coupled to a first terminal of the resistor 121. A second terminal of the resistor 121 is electrically coupled to node 124. A supply voltage terminal of the voltage regulator is electrically coupled to the 3.3-volt voltage supply 123.

The low pass filter circuit 133 is configured to monitor, as an input, the voltage of the laser driver circuit 100 at node 124 and feeds, as an output, a filtered output voltage to the first input terminal of the voltage regulator 122. The voltage regulator 122 compares the filtered output voltage with the first reference voltage across reference resistor 131 and regulates the voltage signal output from the output terminal of the voltage regulator 122 to achieve an intended, or predetermined, voltage drop across the resistor 121 in order to maintain the fraction of the total bias current sourced by the resistor 121 into node 124 at the predetermined, or intended, level. The filtered output voltage may be indicative of an average voltage at the node 124.

In essence, the voltage regulator 122 forces the average voltage drop across the reference resistor 131, which has a resistance of 2160 Ohm in the exemplary embodiment, to match with the voltage drop across the resistor 121, which, as indicated above, has a resistance of 90 Ohm in this exemplary embodiment. Therefore, if 375 uA is sunk from the reference resistor 131, it has a voltage drop across it of 0.81 volts, the resistor 121 has a voltage drop across it of 0.81 volts, and the average current through the resistor 121 is 375×(2160/90)=9 mA. As indicated above, in accordance with this embodiment, the total bias current needed to be sourced is 18 mA. To maintain the output voltage outputted from the output terminal of the voltage regulator 122 at approximately 200 millivolts (mV) below the 3.3 volts supplied by the 3.3-volt voltage supply 123, the remaining 9 mA of the total bias current is sourced by the PMOSFET current source 111. The parasitic capacitance introduced by the PMOSFET current source 111 is acceptable because of the reduction in effective output resistance of the laser driver circuit 100 obtained through the use of the resistor 121.

Figure 5:
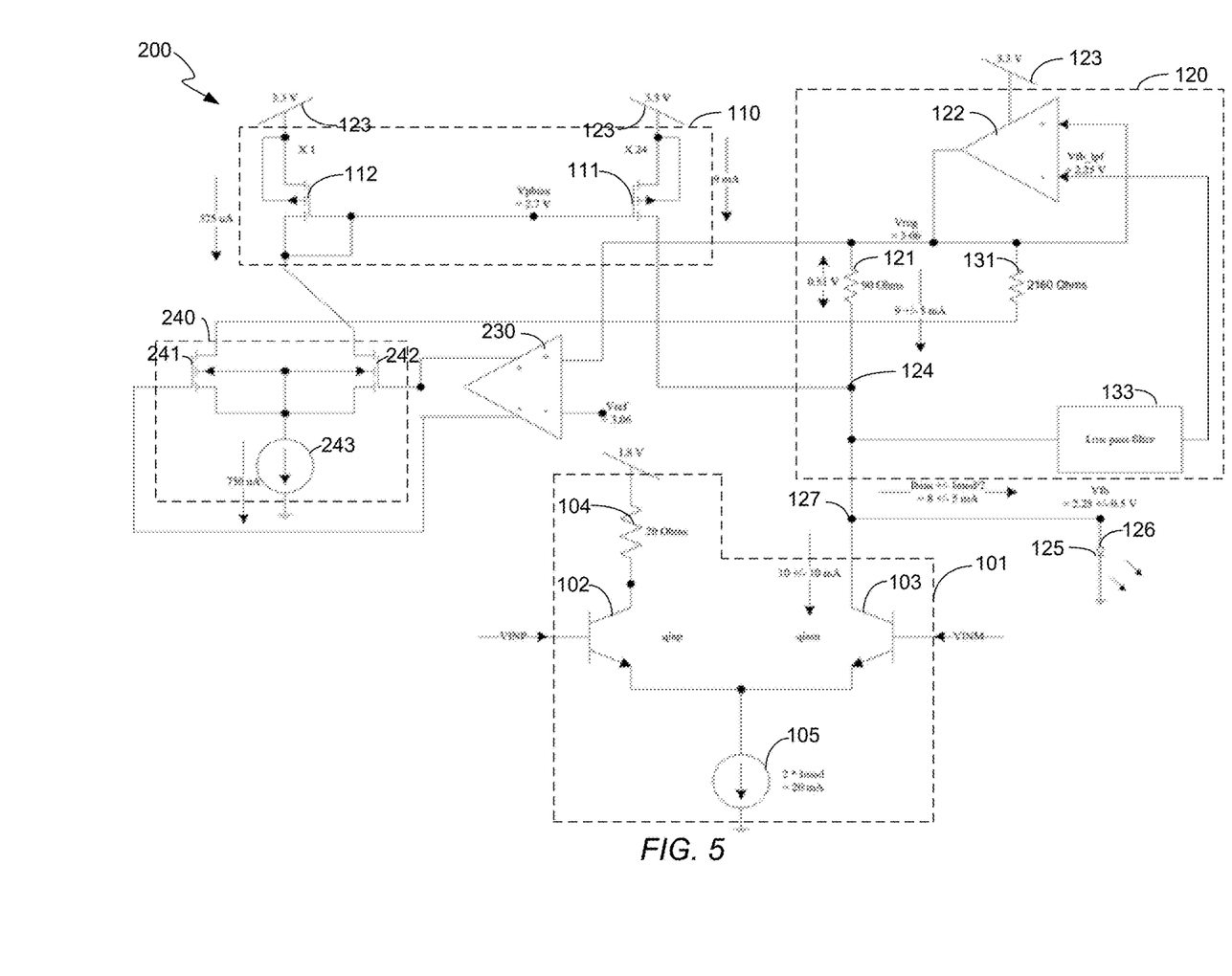
FIG. 5 illustrates a block diagram of a laser driver circuit in accordance with an exemplary embodiment that uses a low supply voltage and that is capable of achieving high-bandwidth operations.

FIG. 5 illustrates a block diagram of a laser driver circuit 200 in accordance with another exemplary embodiment that uses a low supply voltage and that is capable of achieving high-bandwidth performance. As with the exemplary embodiment shown in FIG. 4, in accordance with this exemplary embodiment, the laser driver circuit 200 uses a 3.3-volt voltage supply 123 and the first and second current source circuits comprise the transistor-based current source circuit 110 shown in FIG. 4 and described above and a resistor-based current source circuit 220, respectively. In accordance with this exemplary embodiment, the laser driver circuit 200 also includes a comparator circuit 230 and an NMOSFET differential pair 240 to adjust the fractions of the total bias current that are sourced by the transistor-based and resistor-based current source circuits 110 and 220, respectively, based on the output voltage outputted from the output terminal of the voltage regulator circuit 122 to ensure that the output voltage does not get to close to the supply voltage rail.

The NMOSFET differential pair 240 comprises first and second NMOSFETs 241 and 242, respectively, and a current tail 243. In accordance with this exemplary embodiment, the current tail 243 generates a total reference current of 750 microamperes (µA). The gate terminals of the NMOSFETs 241 and 242 are electrically coupled to first and second output terminals, respectively, of the comparator circuit 230, which may be an operational amplifier. The drain terminal of the NMOSFET 241 is electrically coupled to the second terminal of the reference resistor 131 of the resistor-based current source circuit 220. The drain terminal of the NMOSFET 242 is electrically coupled to the source terminals of the PMOSFETs 111 and 112 of the transistor-based current source circuit 110.

The 750 uA reference current generated by the current tail 243 is divided into first and second reference current fractions based on the result of the comparison made by the comparator circuit 230, which compares the output voltage outputted from the output terminal of the voltage regulator with a second reference voltage that is generated by a suitable reference circuit (not shown), such as a bandgap circuit, for example. The sizes of the first and second reference current fractions will vary depending on how close the output voltage of the voltage regulator 122 is to the 3.3-volt supply voltage rail.

If the output voltage of the voltage regulator 122 exceeds the second reference voltage, then the comparator circuit 230 adjusts the input voltage of the NMOSFET differential pair 240 such that first reference current fraction of the 750 uA total reference current is driven into the transistor-based current source circuit 110 is larger than the second reference current fraction that is driven into the resistor-based current source circuit 220. This ensures more of the total bias current is sourced by the transistor-based current source circuit than is sourced by the resistor-based current source circuit 220, which results in a smaller voltage drop across the resistor 121, and, in turn, a decrease in the output voltage of the voltage regulator output 122 to bring the output voltage back down to a value that is nearer to the second reference voltage and farther from the 3.3-volt supply voltage rail.

This feedback loop for controlling the allocation of the reference current among the transistor-based and resistor-based current source circuits 110 and 220, respectively, is particularly desirable in cases where there are relatively large fluctuations in temperature due to the dependence of VCSEL forward bias voltage on temperature. The lower the temperature, the larger the forward bias voltage of a VCSEL is. At lower temperatures, PMOSFETs are capable of supplying more current for the same device size, so it makes sense to push a larger portion of the bias current through the PMOSFET current source 111 than through the resistor 121 at low temperatures in order to keep the voltage drop across the resistor 121 relatively small and maintain the output voltage of the voltage regulator 122 within acceptable limits.

In all other respects, the laser driver circuit 200 shown in FIG. 5 operates in the same manner as the laser driver circuit 100 shown in FIG. 4 operates. The division of the total bias current sourcing requirements between the transistor-based and resistor-based current source circuits 110 and 220, respectively, ensures that the current through the PMOSFET current source 111 is small enough that the PMOSFET current source 111 can be small enough in size to reduce its parasitic capacitance. The division of the total bias current sourcing requirements between the transistor-based and resistor-based current source circuits 110 and 220, respectively, also ensures that the voltage drop across the resistor 121 is small enough to allow the output voltage of the voltage regulator 122 to be less than 3.3 volts. The reduced parasitic capacitance allows the laser driver circuit 200 to achieve high-bandwidth performance while the reduced output voltage requirement of the voltage regulator 122 allows the laser driver circuit 100 to have a low supply voltage, which is a 3.3-volt voltage supply in this exemplary embodiment.

While the exemplary embodiments described above with reference to FIGS. 4 and 5 depict the first and second current source circuits as being transistor-based and resistor-based current sources, respectively, the inventive principles and concepts are not limited with respect to the devices or circuit element configurations that are used in the current source circuits. Also, the feedback loops that are included in the second current sources 110 and 120 shown in FIGS. 4 and 5, respectively, are not needed in all cases. For example, with reference to FIG. 4, the voltage regulator 122 could be eliminated in some cases and the first terminal of the resistor 121 could be electrically coupled to the voltage supply 123, in which case the first current source circuit 110 would source whatever portion of the total bias current the resistor 121 is not capable of sourcing. Examples of other current source circuits that may be used for these purposes will now be described with reference to FIGS. 6 and 7.

Figure 6:
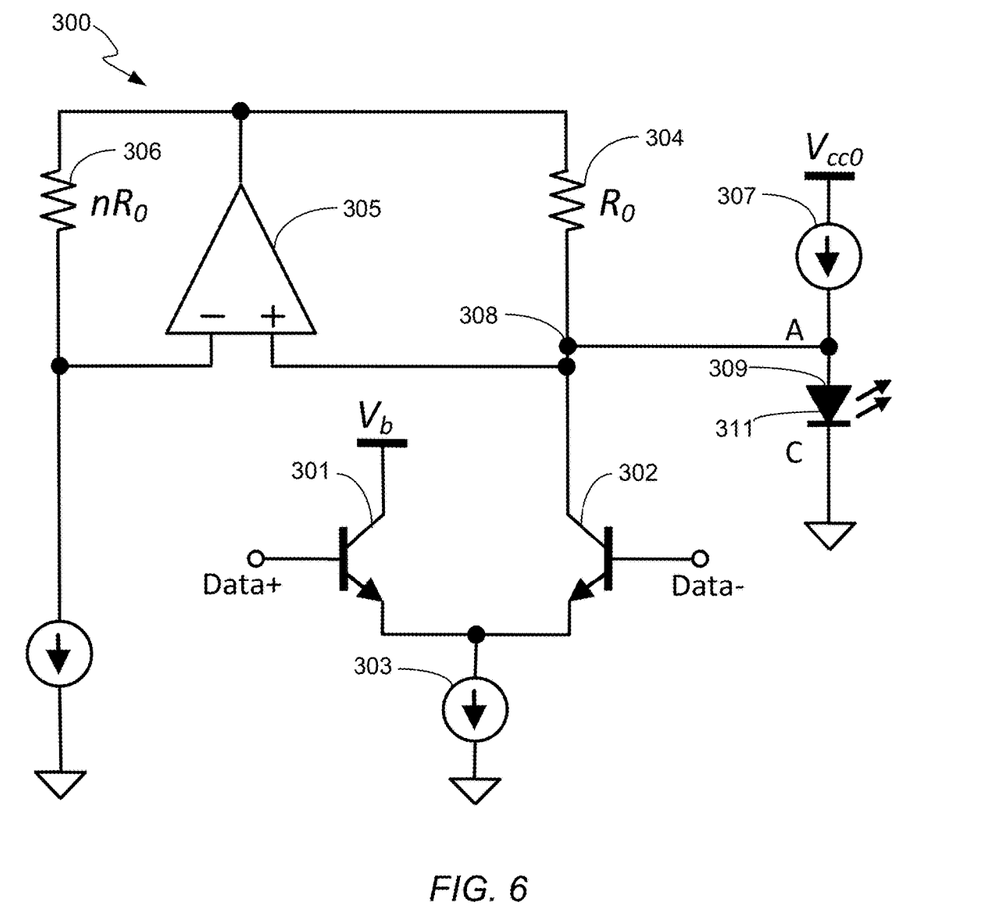
FIG. 6 illustrates a block diagram of a laser driver circuit in accordance with an exemplary embodiment that uses a low supply voltage and that is capable of achieving high-bandwidth operations.

FIG. 6 illustrates a block diagram of laser driver circuit 300 in accordance with another exemplary embodiment that has a low supply voltage and is capable of achieving high-bandwidth performance. The laser driver circuit 300 includes a modulator circuit comprising first and second emitter-coupled BJTs 301 and 302, respectively, that form a differential pair, a current tail 303 and a load resistor 304. The laser driver circuit 300 also includes an amplifier 305, a reference resistor 306, a first current source circuit 307 and an output node, or terminal 308 disposed for connection with an anode 309 of a laser 311, which may be, for example, a VCSEL.

The amplifier 305 has first and second input terminals that are electrically coupled to first terminals of the load and reference resistors 304 and 306, respectively, and has an output terminal that is electrically coupled to second terminals of the load and reference resistors 304 and 306, respectively. The feedback loop comprising the amplifier 305, the load resistor 304 and the reference resistor 306 comprises a second current source circuit of the laser driver circuit 300. The load resistor 304 has a resistance of R0 and the reference resistor 306 has a resistance of nR0, where n is the ratio of the resistance of the reference resistor 306 to the resistance of the load resistor 304. The electrical coupling of the output terminal of the amplifier 305 to the second terminals of the load and reference resistors 304 and 306, respectively, ensures that the same voltage drop occurs over each of them.

The amplifier 305 operates as a voltage shifter that shifts the output voltage of the modulator circuit at the output terminal 308 up or down based on the voltage drops across the load and reference resistors 304 and 306, respectively. Shifting the output voltage of the modulator circuit in this manner causes the current flowing through the load resistor 304 to remain nearly constant. The gain of the amplifier 305 should be large enough to ensure that the voltage drops across the load and reference resistors 304 and 306, respectively, are approximately equal and that the current flowing through the load resistor 304 is approximately equal to the current flowing through the reference resistor 306 multiplied by n.

The modulation current produced by the modulation circuit at the output terminal 308 is added together with first and second fractions of the total bias current sourced into the output terminal 308 by the first and second current source circuits, respectively. The first fraction of the total bias current is the current sourced by the first current source circuit 307 into the output terminal 308. The second fraction of the total bias current is the current sourced into the output terminal 308 by the feedback loop comprising the amplifier 305, the load resistor 304 and the reference resistor 306, which together comprise the second current source circuit. The total bias current plus the modulation current drive the laser 311 to cause it to generate an optical output signal.

The first current source circuit 307 is typically a transistor-based current source circuit similar or identical to the first current source circuits 9, 13 or 110 shown in FIGS. 1, 2 and 4, respectively. However, because the first current source circuit 307 only provides the first fraction of the total bias current rather than the entire total bias current, the size of the transistor or transistors that comprise the first current source circuit 307 can be reduced without requiring an increase in the supply voltage, which may be, for example, a 3.3-volt supply voltage. This ensure that the first current source circuit 307 will contribute very little parasitic capacitance to allow the laser driver circuit 300 to achieve high-bandwidth performance. Because the second current source circuit that sources the second fraction of the total bias current uses passive resistors that have very little parasitic capacitance, it also allows the laser driver circuit 300 to achieve high-bandwidth performance. In addition, the output voltage outputted from the output terminal of the amplifier 305 can easily be below the 3.3-volt supply voltage rail.

Figure 7:
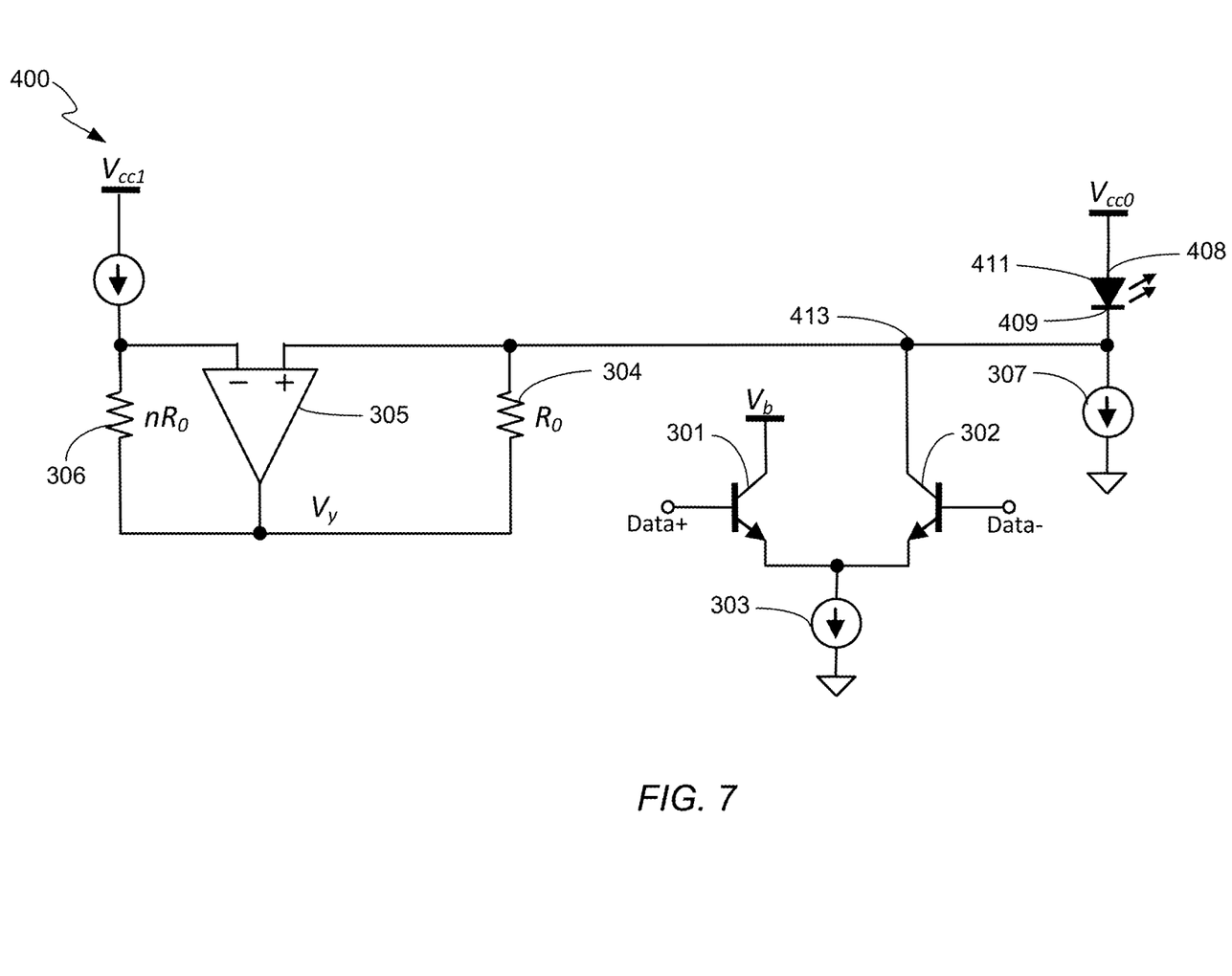
FIG. 7 illustrates a block diagram of a laser driver circuit in accordance with an exemplary embodiment that uses a low supply voltage and that is capable of achieving high-bandwidth operations.

FIG. 7 illustrates a block diagram of laser driver circuit 400 in accordance with another exemplary embodiment that has a low supply voltage and is capable of achieving high-bandwidth performance. The laser driver circuit 400 is similar to the laser driver circuit 300 shown in FIG. 6 except for modifications to allow the laser driver circuit 400 to drive the cathode rather than the anode of the laser 411. Depending on the laser design, sometimes the laser needs to be driven at cathode. The laser driver circuit 400 is configured to provide the same benefits and advantages of the laser driver circuit 300 shown in FIG. 6, but drives the cathode 409 rather than the anode 408 of the laser 411. The laser driver circuit 400 includes a modulator circuit comprising first and second emitter-coupled BJTs 301 and 302, respectively, that form a differential pair, a current tail 303 and a load resistor 304. The laser driver circuit 400 also includes an amplifier 305, a reference resistor 306, a first current source circuit 307 and an output terminal 413 disposed for connection with the cathode 409 of the laser 411, which may be, for example, a VCSEL. The output terminal 413 functions as a current summing node of the laser driver circuit 400.

The amplifier 305 has first and second input terminals that are electrically coupled to first terminals of the load and reference resistors 304 and 306, respectively, and has an output terminal that is electrically coupled to second terminals of the load and reference resistors 304 and 306, respectively. The feedback loop comprising the amplifier 305, the load resistor 304 and the reference resistor 306 comprises a second current source circuit of the laser driver circuit 400. The load resistor 304 has a resistance of RO and the reference resistor 306 has a resistance of nR0, where n is the ratio of the resistance of the reference resistor 306 to the resistance of the load resistor 304. The electrical coupling of the output terminal of the amplifier 305 to the second terminals of the load and reference resistors 304 and 306, respectively, ensures that the same voltage drop occurs over each of them.

The amplifier 305 operates as a voltage shifter that shifts the output voltage of the modulator circuit at the output terminal 413 up or down based on the voltage drops across the load and reference resistors 304 and 306, respectively. Shifting the output voltage of the modulator circuit in this manner causes the current flowing through the load resistor 304 to remain nearly constant. The modulation current produced by the modulation circuit at the output terminal 413 is added together with first and second fractions of the total bias current sourced into the output terminal 413 by the first and second current source circuits, respectively. The first fraction of the total bias current is the current sourced by the first current source circuit 307 into the output terminal 413. The second fraction of the total bias current is the current sourced into the output terminal 413 by the feedback loop comprising the amplifier 305, the load resistor 304 and the reference resistor 306, which together comprise the second current source circuit. The total bias current plus the modulation current drive the laser 411 to cause it to generate an optical output signal.

As indicated above, although the first current source circuit 307 is typically a transistor-based current source circuit similar or identical to the first current source circuits 9, 13 or 110 shown in FIGS. 1, 2 and 4, respectively, it only provides the first fraction of the total bias current rather than the entire total bias current. Consequently, the size of the transistor or transistors that comprise the first current source circuit 307 can be reduced without requiring an increase in the supply voltage, which may be, for example, a 3.3-volt supply voltage. This ensure that the first current source circuit 307 will contribute very little parasitic capacitance to allow the laser driver circuit 400 to achieve high-bandwidth performance. Because the second current source circuit that sources the second fraction of the total bias current uses passive resistors that have very little parasitic capacitance, it also allows the laser driver circuit 400 to achieve high-bandwidth performance. In addition, the output voltage outputted from the output terminal of the amplifier 305 can easily be below the 3.3-volt supply voltage rail.

Figure 8:
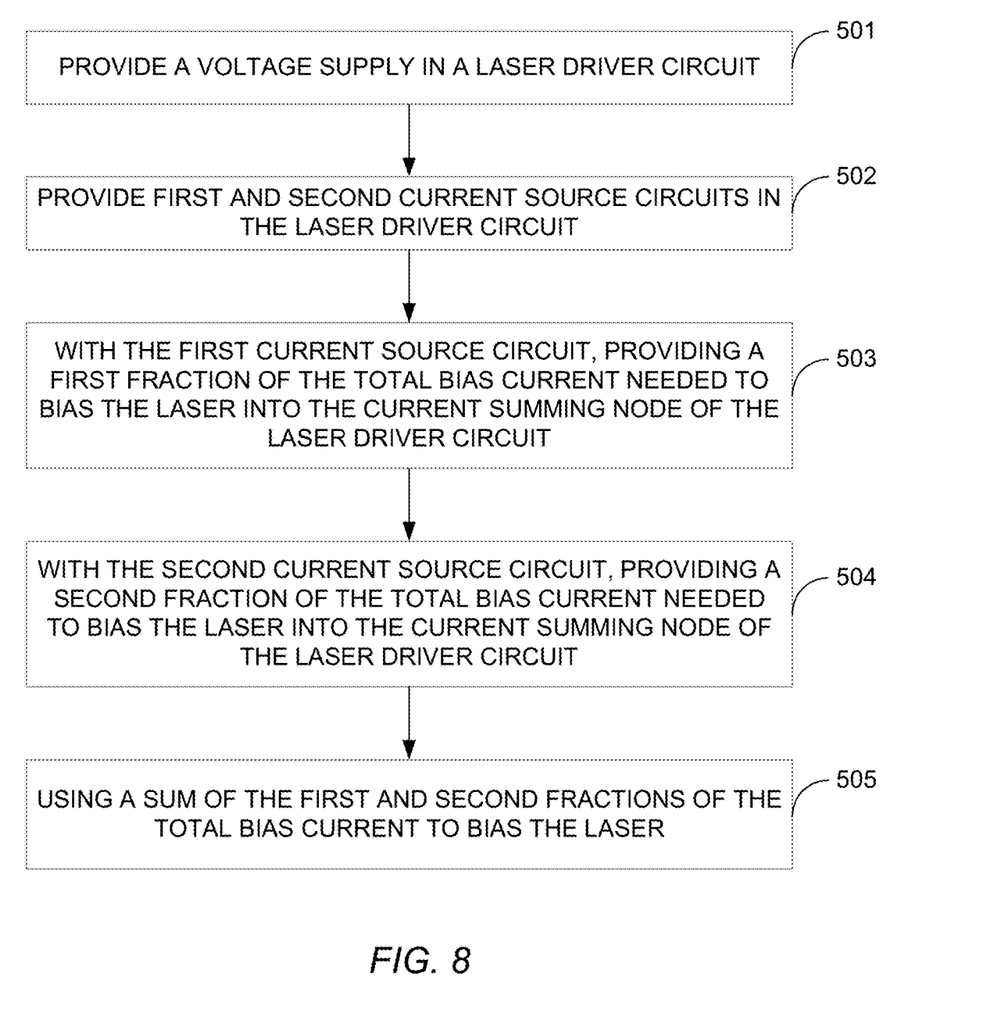
FIG. 8 illustrates a flow diagram that represents a method in accordance with an exemplary embodiment for reducing a voltage supply that is needed in a laser driver circuit that drives at least one laser while allowing the laser driver circuit to achieve high-bandwidth performance.

FIG. 8 illustrates a flow diagram that represents a method in accordance with an exemplary embodiment for reducing a voltage supply that is needed in a laser driver circuit that drives at least one laser while allowing the laser driver circuit to achieve high-bandwidth performance. As indicated by block 501, a laser driver circuit is provided with a voltage supply. As indicated by block 502, the laser driver circuit is provided with first and second current source circuits that are electrically coupled to a current summing node of the laser driver circuit having an output terminal that is electrically coupled to the summing node and to an electrode of the laser. As indicated by block 503, the first current source circuit provides a first fraction of a total bias current needed to bias the laser into the current summing node. As indicated by block 504, the second current source circuit provides a second fraction of the total bias current needed to bias the laser into the summing node. As indicated by block 505, the laser driver circuit uses a sum of the first and second fractions of the total bias current to bias the laser.

It should be noted that the inventive principles and concepts have been described with reference to a few exemplary embodiments. Persons of skill in the art will understand how the principles and concepts of the invention can be applied to other embodiments not explicitly described herein. It should also be noted that the laser driver circuits and methods described above with reference to FIGS. 3-7 are merely examples of suitable circuit configurations and methods that demonstrate the inventive principles and concepts. As will be understood by those skilled in the art in view of the description being provided herein, many modifications may be made to the embodiments described herein while still achieving the goals of described herein, and all such modifications are within the scope of the invention.

What is claimed is:

1. A method for driving at least one light source at a low voltage level by a driver circuit while allowing the driver circuit to achieve high-bandwidth performance, the method comprising:

providing a voltage supply with the low voltage level to the driver circuit;

providing first and second current source circuits in the driver circuit, the first and second current source circuits being electrically coupled to a node of the driver circuit, the driver circuit having an output terminal that is electrically coupled to said node and to an electrode of said at least one light source;

with the first current source circuit, providing a first fraction of a total current needed to drive said at least one light source into the node through a transistor, wherein the first fraction comprises a first non-zero value; and with the second current source circuit, providing a second fraction of the total current needed to drive said at least one light source into said node through a resistor, wherein the second fraction is equal to or less than the first fraction, wherein the second fraction comprises a second non-zero value, wherein current provided by the first current source circuit and current provided by the second current source circuit are independent of one another, and wherein the second fraction is provided simultaneous with the first fraction.

2. The method of claim 1, wherein the second fraction provides less than 50 percent of the total current needed to drive the at least one light source.

3. The method of claim 2, wherein the total current is configured to respond to a change of a data input signal provided to the driver circuit, and wherein the second current source circuit reacts to the change of the data input signal faster than the first current source circuit such that a change in the total current is substantially drawn from the second current source circuit.

4. The method of claim 3, wherein the second current source circuit further comprises a voltage regulator and a first resistor, the voltage regulator having at least first and second input terminals, at least a first output terminal and at least a first supply voltage terminal, the first supply voltage terminal of the voltage regulator being electrically coupled to the voltage supply, the first output terminal of the voltage regulator being electrically coupled to a first terminal of the first resistor, a second terminal of the first resistor being electrically coupled to said node, the method further comprising:
with the voltage regulator, regulating a voltage signal output from the first output terminal of the voltage regulator to achieve an intended voltage drop across the first resistor in order to maintain the second fraction of the total current provided into said node at a predetermined level.

5. The method of claim 4, wherein the second current source circuit further comprises a low pass filter circuit having an input terminal that is electrically coupled to said node and an output terminal that is electrically coupled to the first input terminal of the voltage regulator, the second input terminal of the voltage regulator receiving a first reference voltage, the method further comprising:
with the low pass filter circuit, at the input terminal of the low pass filter circuit, receiving an output voltage of the driver circuit at said node and, at the output terminal of the low pass filter circuit, providing a filtered output voltage to the first input terminal of the voltage regulator; and
with the voltage regulator, comparing the filtered output voltage with the first reference voltage and regulating the voltage signal output from the first output terminal of the voltage regulator to achieve the intended voltage drop across the first resistor in order to maintain the second fraction of the total current provided into said node at the predetermined level.

6. The method of claim 5, further comprising:
providing a comparator circuit in the driver circuit for preventing the voltage signal output from the first output terminal of the voltage regulator from obtaining a level that is too close to a supply rail level; and
at a first input terminal of the comparator circuit, receiving the voltage signal output from the first output terminal of the voltage regulator;
at a second terminal of the comparator circuit, receiving a second reference voltage; and
in the comparator circuit, comparing the voltage signal output from the first output terminal of the voltage regulator with the second reference voltage and causing the first fraction of the total current to be increased and the second fraction of the total current to be decreased if the voltage signal output from the first output terminal of the voltage regulator exceeds the second reference voltage.

7. The method of claim 1, wherein the second current source circuit comprises a feedback circuit, the method further comprising:
with the feedback circuit, responding to a change of a data input signal provided to the driver circuit and controlling said node at a voltage level such that the second fraction provides approximately between 40 to 50 percent of the total current needed to drive the at least one light source.

8. The method of claim 1, wherein the method further comprises:
arranging the at least one light source in a circuit branch having an end coupled to the node, wherein the circuit branch comprises a branch resistance that is parallel with the resistor of the second current source circuit to obtain lower effective resistance at said node.

9. The method of claim 1, wherein the second current source circuit comprises an amplifier circuit having first and second input terminals, an output terminal, a first resistor and a second resistor, the first resistor being electrically coupled between the second input terminal of the amplifier circuit and the output terminal of the amplifier circuit, the second input terminal of the amplifier circuit being electrically coupled to said node, the second resistor being electrically coupled between the first input terminal of the amplifier circuit and the output terminal of the amplifier circuit, the method further comprising:
providing a modulator circuit in the driver circuit, the modulator circuit having a driver input terminal and an output terminal, the driver input terminal receiving a data input signal and the output terminal of the modulator circuit being electrically coupled to said node; and
with the amplifier circuit, adjusting a modulator output voltage outputted from the output terminal of the modulator circuit based on voltage drop across the first and second resistors to maintain the second fraction of the total current at a substantially constant predetermined level.

10. A driver circuit capable of operating at a low voltage level to drive at least one light source while allowing the driver circuit to achieve high-bandwidth performance, the driver circuit comprising:
a modulator circuit having a driver input terminal that receives a data input signal, the modulator circuit having an output terminal that is electrically coupled to a node of the driver circuit;
a first current source circuit electrically coupled to said node through a transistor; and
a second current source circuit electrically coupled to said node, the driver circuit having an output terminal that is electrically coupled to said node and to an electrode of said at least one light source, the first current source circuit providing a first fraction of a total current needed to drive said at least one light source into said node, the second current source circuit providing a second fraction of the total current needed to drive said at least one light source into said node, wherein the first fraction comprises a first non-zero value, wherein the second fraction comprises a second non-zero value, wherein the first fraction and second fraction are provided substantially simultaneously with one another, wherein current provided by the first current source circuit and current provided by the second current source circuit are independent of one another, and wherein the second fraction is approximately equal to or less than the first fraction.

11. The driver circuit of claim 10, wherein the second fraction provides approximately between 40 to 50 percent of the total current needed to drive the at least one light source.

12. The driver circuit of claim 11, wherein the first current source circuit reacts to a change of the data input signal at a first rate and the second current source circuit reacts to the change of the data input signal at a second rate, wherein the second rate is faster than the first rate.

13. The driver circuit of claim 12, wherein the second current source circuit further comprises a voltage regulator and a first resistor, the voltage regulator having at least first and second input terminals and at least a first output terminal, the first output terminal of the voltage regulator being electrically coupled to a first terminal of the first resistor, a second terminal of the first resistor being electrically coupled to said node, wherein the voltage regulator regulates a voltage signal output from the first output terminal of the voltage regulator to achieve an intended voltage drop across the first resistor in order to maintain the second fraction of the total current provided into said node at a predetermined level.

14. The driver circuit of claim 13, wherein the second current source circuit further comprises:
a low pass filter circuit having an input terminal that is electrically coupled to said node and an output terminal that is electrically coupled to the first input terminal of the voltage regulator, the second input terminal of the voltage regulator receiving a first reference voltage, the low pass filter circuit receiving, at the input terminal of the low pass filter circuit, an output voltage of the driver circuit and is configured to provide, at the output terminal of the low pass filter circuit, a filtered output voltage to the first input terminal of the voltage regulator, and wherein the voltage regulator compares the filtered output voltage with the first reference voltage and regulates the voltage signal output from the first output terminal of the voltage regulator to achieve the intended voltage drop across the first resistor in order to maintain the second fraction of the total current provided at said node at the predetermined level.

15. The driver circuit of claim 10, wherein the at least one light source comprises a branch resistance, wherein the branch resistance is in parallel arrangement with the resistor of the second current source circuit such that an effective resistance at said node is reduced.

16. The driver circuit of claim 10, wherein the second current source circuit comprises a feedback circuit, wherein the feedback circuit responds to a change of the data input signal and controls said node at a voltage level such that the second fraction provides approximately between 40 to 50 percent of the total current needed to drive the at least one light source.

17. The driver circuit of claim 10, wherein said second current source circuit is electrically coupled to said node through a resistor and wherein said resistor has a resistance value of approximately 90 Ohm or less.

18. The driver circuit of claim 10, wherein the second current source circuit comprises an amplifier circuit having first and second input terminals, an output terminal, a first resistor and a second resistor, the first resistor being electrically coupled between the second input terminal of the amplifier circuit and the output terminal of the amplifier circuit, the second input terminal of the amplifier circuit being electrically coupled to said node, the second resistor being electrically coupled between the first input terminal of the amplifier circuit and the output terminal of the amplifier circuit, wherein the amplifier circuit adjusts a modulator output voltage outputted from the output terminal of the modulator circuit based on voltage drop across the first and second resistors to maintain the second fraction of the total current at a substantially constant predetermined level.

19. A method for reducing a voltage supply that is needed in a laser driver circuit that drives at least one laser while allowing the laser driver circuit to achieve high-bandwidth performance, the method comprising:
providing a voltage supply to the laser driver circuit;
providing a parallel combination of a transistor-based current source circuit and a resistor-based current source circuit in the laser driver circuit, the transistor-based current source circuit and the resistor-based current source circuit having first terminals that are electrically coupled to the voltage supply and second terminals that are electrically coupled together at a node, wherein an output terminal of the laser driver circuit is electrically coupled to said node and to an electrode of the at least one laser;
with the transistor-based current source circuit, sourcing a first fraction of a total bias current needed to bias the at least one laser into said node, wherein the first fraction comprises a first non-zero value;
with the resistor-based current source circuit, sourcing a second fraction of the total bias current needed to bias the at least one laser into said node, wherein the second fraction comprises a second non-zero value, wherein current provided by the resistor-based current source circuit and current provided by the transistor-based current source circuit are independent of one another, and wherein the second fraction is provided substantially simultaneous with the first fraction; and
in the laser driver circuit, using a sum of the first and second fractions of the total bias current to bias said at least one laser.

20. The method of claim 19, wherein the resistor-based current source circuit comprises a voltage regulator having at least first and second input terminals, at least a first output terminal, and at least a first supply voltage terminal, the first supply voltage terminal of the voltage regulator being electrically coupled to the voltage supply and constituting the first terminal of the resistor-based current source circuit, the first output terminal of the voltage regulator being electrically coupled to a first terminal of a first resistor of the resistor-based current source circuit, a second terminal of the first resistor constituting the second terminal of the resistor-based current source circuit, the method further comprising:
with the voltage regulator, regulating a voltage signal output from the first output terminal of the voltage regulator to achieve an intended voltage drop across the first resistor in order to maintain the second fraction of the total bias current sourced into said node at a predetermined level.

* * * * *